(12) United States Patent
Efferenn et al.

(10) Patent No.: US 7,125,778 B2
(45) Date of Patent: Oct. 24, 2006

(54) METHOD FOR FABRICATING A SELF-ALIGNING MASK

(75) Inventors: Dirk Efferenn, Dresden (DE); Ulrike Grüning Von Schwerin, München (DE); Hans-Peter Moll, Dresden (DE); Jörg Radecker, Dresden (DE); Andreas Wich-Glasen, Langebrück (DE)

(73) Assignee: Infineon Technologies AG, Munich (DE)

( * ) Notice: Subject to any disclaimer, the term of this patent is extended or adjusted under 35 U.S.C. 154(b) by 278 days.

(21) Appl. No.: 10/228,886

(22) Filed: Aug. 27, 2002

(65) Prior Publication Data

US 2003/0040184 A1 Feb. 27, 2003

(30) Foreign Application Priority Data

Aug. 27, 2001 (DE) ................. 101 41 841

(51) Int. Cl.
*H01L 21/336* (2006.01)
(52) U.S. Cl. .............. 438/294; 438/296; 438/694
(58) Field of Classification Search ........ 438/294–296, 438/299, 364–366, 408–409, 710–714, 706–707, 438/723, 694–697, 745, 756, 734–735
See application file for complete search history.

(56) References Cited

U.S. PATENT DOCUMENTS 5,731,239 A    3/1998   Wong et al.
6,048,775 A    4/2000   Yao et al.
6,057,210 A    5/2000   Yang et al.
6,159,822 A   12/2000   Yang et al.
6,207,538 B1   3/2001   Pan et al.
6,261,957 B1   7/2001   Jang et al.
6,270,353 B1   8/2001   Andrews et al.
6,326,309 B1 * 12/2001  Hatanaka et al. ........... 438/693
6,372,605 B1 *  4/2002  Kuehne et al. ............. 438/427

FOREIGN PATENT DOCUMENTS

DE    195 48 058 A1   6/1997
TW        380298      7/1987

OTHER PUBLICATIONS

D.R. Cote et al.: "Plasma-assisted chemical vapor deposition of dielectric thin films for ULSI semiconductor circuits", *IBM J. Res. Develop.*, vol. 43, No. ½, Jan./Mar. 1999, pp. 5-38.
Stanley Wolf et al.: "Silicon Processing for the VLSI Era: Process Technology", 2nd. ed., Oct. 1999, pp. 795-797.

* cited by examiner

*Primary Examiner*—Thanhha Pham
(74) *Attorney, Agent, or Firm*—Laurence A. Greenberg; Werner H. Stemer; Ralph E. Locher

(57) ABSTRACT

A description is given of a method for a selective masking of a structure with a small structure surface with respect to a structure with a larger structure surface. To that end, the structures are filled with a covering layer. The covering layer is formed with a larger thickness above the first structure, which has the larger structure surface, than above the second structure. Afterward, the covering layer is removed by a homogeneous removal method, so that first the structure surface of the second structure is uncovered. A simple self-aligning method for fabricating a mask for uncovering the second structure is thus provided.

14 Claims, 1 Drawing Sheet

METHOD FOR FABRICATING A SELF-ALIGNING MASK

BACKGROUND OF THE INVENTION

FIELD OF THE INVENTION

The invention relates to a method for fabricating a self-aligning mask for a second structure having a small surface, which is disposed at a distance from a first structure with a large surface. The structures are covered with a covering layer, the second structure being covered with a covering layer having a smaller thickness than the first structure.

Methods for fabricating a self-aligning mask are known in a wide variety of areas in semiconductor technology and are used, for example, for the precise positioning of a semiconductor transistor. A corresponding method is described in Published, Non-Prosecuted German Patent Application DE 195 48 058 A1. In this method, uniformly spaced-apart structures are overfilled with a covering layer and then the covering layer is removed as far as the surfaces of the structures. The structures are subsequently removed and a defined mask for the formation of a gate electrode of a transistor is formed in this way.

Structures with area regions of different sizes are used in a multiplicity of components, in particular semiconductor components. The structures essentially have the same height. Depending on the application, it is advantageous to process only the structures with small areas and to cover the structures with large areas by a mask. Photolithographic methods, for example, are used to fabricate the mask, which methods, however, are relatively complicated and not self-aligning.

SUMMARY OF THE INVENTION

It is accordingly an object of the invention to provide a method for fabricating a self-aligning mask which overcomes the above-mentioned disadvantages of the prior art methods of this general type, which is used to fabricate a self-aligning mask for a selective selection of a structure with a small area.

With the foregoing and other objects in view there is provided, in accordance with the invention, a method for fabricating a self-aligning mask for a second structure with a small surface disposed at a distance from a first structure with a larger surface. The method includes covering the first structure and the second structure with a covering layer, a first area of the covering layer covering the second structure has a smaller thickness than a second area of the covering layer covering the first structure. The covering step further includes forming the covering layer with a sidewall disposed between the first structure and the second structure. The sidewall declines from the first structure towards the second structure. The covering layer is formed with a substantially constant thickness above the second structure. The covering layer is removed substantially homogeneously until the second structure is uncovered, and the first structure remains completely covered by the covering layer.

An essential advantage of the method is that a structure with a small area can be uncovered selectively with respect to a structure with a large area. This is achieved in a simple manner by virtue of the fact that the structure with the small area and the structure with the large area are covered with a covering layer, the covering layer having a larger thickness above the structure with the large area than above the structure with the small area.

Between the different heights of the covering layer, the covering layer falls in a sidewall, the sidewall ending before the structure with the small area. For the selective uncovering of the structure with the small area, it suffices to remove the covering layer virtually homogeneously until the structure with the small area is uncovered. The remaining covering layer thus constitutes a self-aligning mask for the structure with the small area. On account of the method according to the invention, it is not necessary to use photolithographic methods for the selective uncovering of the small structure. Consequently, a simple and cost-effective method for uncovering the structure with the small area is provided.

The covering layer is preferably formed in such a way that the covering layer is formed in a virtually plane fashion above the structure with the small area.

In an advantageous embodiment, the covering layer is formed in the form of a silicon oxide layer. In a further embodiment of the invention, the covering layer is fabricated from silicon nitride.

A simple method for fabricating the covering layer is achieved with a plasma deposition process and a back sputtering process. The plasma deposition process and the back sputtering process are preferably carried out simultaneously. The back sputtering process ensures that, on the one hand, a smaller layer thickness is deposited on the first structure and, on the other hand, the covering layer falls with a defined sidewall from the region above the second structure to the region above the first structure. In this way, it is possible to reduce the distance which the first and second structures must have between one another in order to be able to selectively uncover the second structure.

Particularly good results are achieved during the plasma deposition process with a pressure of 2 to 20 mTorr.

A simple method of removing the covering layer consists in an anisotropic etching operation.

Experiments show that a particularly suitable covering layer is achieved during a back sputtering process that is carried out with a power of 500 watts.

Furthermore, it has proved to be advantageous to form the sidewall at an angle of approximately 45°. An angle of 45° represents a compromise between a stable covering layer and a rapidly falling sidewall, since the steepness of the sidewall influences the required distance between a large-area and a small-area structure.

In accordance with an added mode of the invention, there is the step of forming the second structure with a surface that is smaller than 1.5 times a depth of a trench formed between the first structure and the second structure.

In accordance with another feature of the invention, there is the step of forming the first structure with a surface that is larger than three times a depth of a trench formed between the first structure and the second structure.

In accordance with a further feature of the invention, there is the step of using the covering layer as a mask during further processing of the second structure.

Other features which are considered as characteristic for the invention are set forth in the appended claims.

Although the invention is illustrated and described herein as embodied in a method for fabricating a self-aligning mask, it is nevertheless not intended to be limited to the details shown, since various modifications and structural changes may be made therein without departing from the spirit of the invention and within the scope and range of equivalents of the claims.

The construction and method of operation of the invention, however, together with additional objects and advan-

DESCRIPTION OF THE PREFERRED EMBODIMENTS

Figure 1:
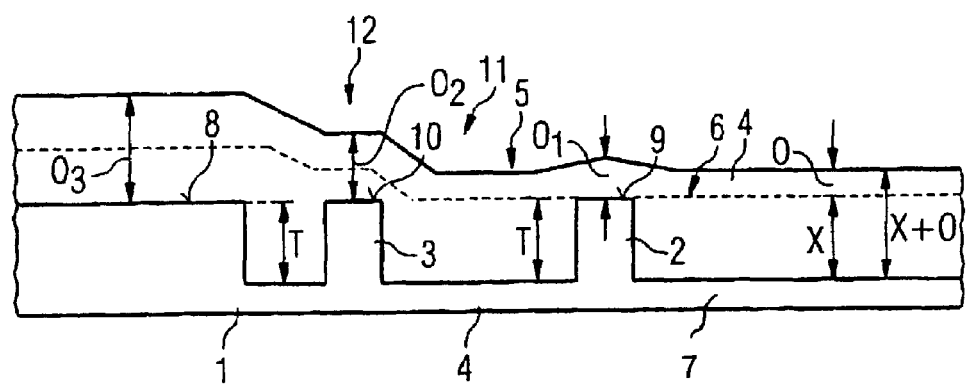
FIG. 1 is a diagrammatic, cross-sectional view through a semiconductor substrate according to the invention.

Referring now to the figures of the drawing in detail and first, particularly, to FIG. 1 thereof, there is shown a configuration of a first and a second structure 1, 2, which were formed on a semiconductor substrate 7 in this exemplary embodiment. A trench is formed between the first and second structures 1, 2. In a simple embodiment, the first and second structures 1, 2 constitute webs having differently sized cross sections. The first structure 1 and the second structure 2 have a first and second structure surface 8, 9, respectively, which are disposed at an approximately identical height. The first and second structure surfaces 8, 9 are preferably disposed at the same height. The second structure 2 is surrounded by a trench having a defined depth.

In a further embodiment, a third structure 3 likewise having the form of a web is formed between the first and second structures 1, 2. The third structure 3 has a third structure surface 10, which is formed at approximately the same height as the first and second structure surfaces 8, 9.

The first, second and third structures illustrated in FIG. 1 may be fabricated from any desired material, but the formation in the form of a semiconductor material constitutes an important area of application of the invention. The first, second and third structures 1, 2, 3 are preferably fabricated from crystalline silicon, polysilicon, silicon oxide or silicon nitride. The first and second structure surfaces 8, 9 have a different area size.

What is crucial for the selection of the small area is the ratio to the trench depth. The second structure surface 9 preferably has an area that, in one dimension, is less than/equal to 1.5 times a trench depth T. The first structure surface 8, which constitutes the large area, should have an area of, preferably, in one dimension, larger than three times the depth T of the trench formed between the first and second structure surfaces 8, 9.

During the fabrication of semiconductor structures, it may be advantageous to be able to process the second structure 2 selectively. To that end, it is known in the prior art to create corresponding masks by photolithographic methods. The creation of the mask by a photolithographic method requires precise alignment of the mask with the second structure 2 in order to be able to process the latter selectively. This is very complicated in particular in the case of relatively small structures and small distances between the structures, as are used in semiconductor technology in particular in the area of integrated circuits such as e.g. of memory technology.

The invention exhibits a solution approach by which a second structure 2 with a smaller structure surface 9 can be selectively masked with respect to a first structure with a larger structure surface 8. To that end, a covering layer 4 is applied to the substrate 7 and the first, second and third structures 1, 2, 3, to be precise in such a way that above the first substrate 1 a larger thickness of the covering layer 4 is formed, which falls via a sidewall to a smaller thickness of the covering layer 4 above the second structure 2. In this case, it is necessary for an end 11 of a sidewall 12 to be disposed laterally offset with respect to the second substrate surface 9. The covering layer 4 applied after the deposition process has a first surface structure 5.

The covering layer 4 is preferably deposited by an HDP-TEOS process preferably in the form of a silicon dioxide layer or a silicon nitride layer as the covering layer 4. Preferably, the covering layer used is a material that, with respect to the material of the second structure 2, has a selectivity with regard to a removal process, since the covering layer 4 is preferably used as a resistance mask for the processing of the second structure 2 in the further method progression.

During the HDP process, the covering layer 4 is deposited onto the substrate 7 and the first, second and third structures 1, 2, 3 by a plasma-enhanced gas deposition method. In addition, steps of the covering layer 4 are converted into inclined sidewalls by a sputtering process. By way of example, silane ($SiH_4$), oxygen is used as the deposition gas and argon or helium is used as the sputtering gas. In addition to silane, nitride ($N_2$) is used as a working gas for the fabrication of a nitride layer. By way of example, if the intention is to fabricate a phosphorous-doped oxide layer, silane, oxygen and phosphine ($PH_3$) is additionally used.

The sputtering process is set in such a way that the sidewall 12 is established in the transition region between two surfaces of the covering layer 4, which are disposed at different heights, preferably with an angle of approximately 45°. Experiments have shown that a preferred formation of the sidewall 12 is achieved with a sputtering power of 500 watts. Furthermore, experiments have shown that a particular quality of the covering layer 4 is achieved at a pressure of the deposition method of 2 to 20 mTorr. The gas plasma that assists the deposition process is preferably operated with a radio frequency power of 1,000 to 10,000 watts.

Depending on the embodiment, it is also possible to fabricate sidewalls with an inclination other than 45°. All that is essential in this case is that the end 11 of the sidewall 12 is disposed laterally offset between the first and second structures 1, 2.

Furthermore, it has been shown that a particular quality of the self-aligned mask is obtained if the covering layer 4 is formed in a virtually plane fashion in the region above the second structure 2.

In the exemplary embodiment illustrated, the third structure 3 is formed between the first and second structures 1, 2 and disposed below the sidewall 12. Furthermore, the filled covering layer 4 has a first surface structure 5, which has a slight elevation in the region of the second structure 2. The elevation should not be too large, however, for an optimum process, and should preferably tend toward zero.

In a further method step, the covering layer 4 is preferably removed homogeneously until the second substrate surface 9 is uncovered. In this method stage, the covering layer 4 has a second surface structure 6, depicted as a dashed line in FIG. 1. The second substrate surface 9 is uncovered as a first substrate surface since the covering layer 4 has a smaller thickness above the second structure 2 than above the first and third structures 1, 3. A relatively homogeneous removal method during which the covering layer 4 is removed at the same removal rate both above the first, the second and the third structure 1, 2, 3 ensures that the second substrate surface 9 is uncovered first.

The removal of the covering layer 4 is carried out for example by an etching method adapted to the material of the covering layer 4. A dry etching operation or a wet etching operation can be performed, depending on the embodiment of the covering layer 4. For the further processing of the second structure 2, it is advantageous if the covering layer 4 reacts selectively with respect to the material of the second structure 2, in particular is not etched away, with regard to an etching operation.

After the removal operation, the covering layer 4 has the second surface structure 6, which exhibits essentially the same contour as the first surface structure 5.

The method described has the advantage that a second structure 2 with a smaller surface than a first structure 1 can be opened selectively with a self-aligned mask in a simple manner. The mask is constituted by the covering layer 4.

Figure 2:
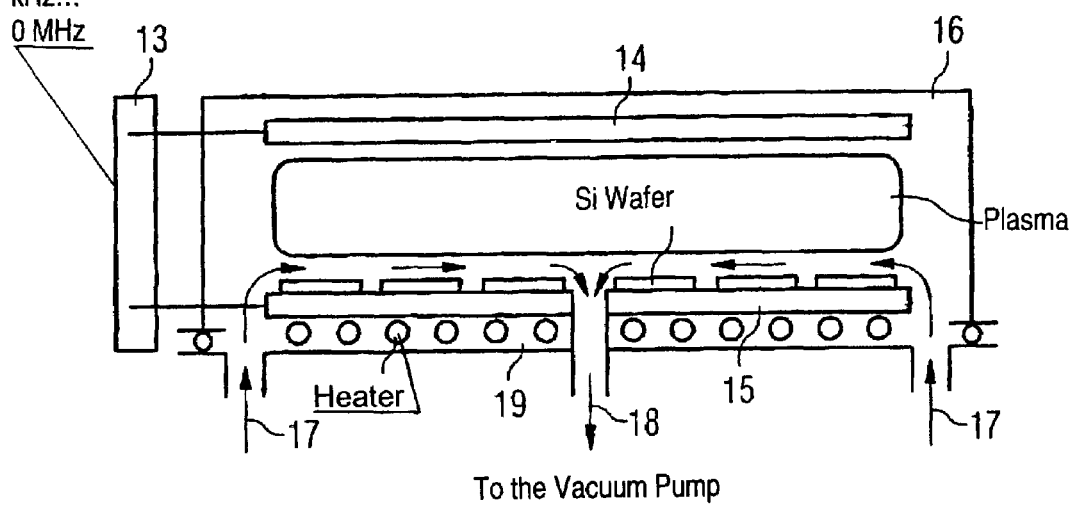
FIG. 2 is an illustration of a gas reactor.

FIG. 2 shows a schematic configuration for carrying out the method according to the invention. FIG. 2 illustrates a radio frequency generator 13, which is connected to two electrodes 14, 15 via electrical lines. The electrodes 14, 15 are disposed in a gas reactor 16 having gas inlets 17 and a gas outlet 18. The gas inlets 17 are connected to gas sources that provide the gases that are used for the deposition of the covering layer 4. The substrates 7 with the first, second and third structures 1, 2, 3 are placed on the second electrode 15. A heating configuration 19 is formed below the second electrode 15 and can be used to set a desired temperature in the gas reactor 16. On account of the radio frequency generated by the RF generator 13, a gas plasma is ignited between the first and second electrodes 14, 15 and, depending on the gas composition, the corresponding covering layer 4 is deposited on the substrates 7. In addition to the normal radio frequency the second electrode 2 is negatively charged with respect to the first electrode 14, so that ions of a sputtering gas used, such as argon or helium, are accelerated in the direction of the substrate 7. As a result of the acceleration of the sputtering ions, material is sputtered in the region of a step of the covering layer 4 and a sidewall 12 is thus produced in the transition between surface regions of the covering layer 4 that have different heights. Moreover, the dimensions chosen for the heights of the first and second structures 1, 2 and the sizes of the structure surfaces of the first and second structures and the deposition method chosen have the effect that the thickness of the covering layer 4 in the region of the second structure 2 is reduced compared with the region of the first structure 1. To that end, the area of the second substrate surface 9 is made so small that the sidewalls forming in the edge regions of the second structure 2 meet in the center above the second structure and, consequently, the growth of the covering layer 4 on the second structure is significantly limited compared with the growth of the covering layer 4 above the first structure 1. In this way, the covering layer 4 formed with different thicknesses is fabricated above the first structure 1 and the second structure 2.

According to experimental experience, the second structures 2 with the smaller surface are preferably overfilled with the covering layer 4 until small hats are virtually no longer formed above the second structures 2. Under this assumption, the range of the structure-dependent overfilling is comparable with the size of the second structures 2. Consequently, the distance between a first structure 1 and a second structure 2 should have at least twice the length of the second structure 2 in order to ensure a selectivity between the first and second structures during the formation of the self-aligning mask.

We claim:

1. A method for fabricating a self-aligning mask in a configuration, which comprises the steps of:
   forming, on a semiconductor substrate, a second protrusion structure with a small top surface disposed at a distance from a first protrusion structure with a larger top surface, the first and second protrusion structures having the same height and constituting webs having differently sized cross sections with a trench formed therebetween, the small top surface and the larger top surface constituting the total top surface of the configuration;
   covering the first protrusion structure and the second protrusion structure with a covering layer, a first area of the covering layer covering the second structure protrusion having a smaller thickness than a second area of the covering layer covering the first protrusion structure, the covering step further including:
      forming the covering layer with a sidewall disposed between the first protrusion structure and the second protrusion structure, the sidewall declining from the first protrusion structure towards the second protrusion structure; and
      forming the covering layer with a substantially constant thickness above the second protrusion structure; and
   removing the covering layer substantially homogeneously until the second protrusion structure being completely uncovered, and the first protrusion structure remaining completely covered by the covering layer.

2. The method according to claim 1, which comprises depositing a silicon oxide layer as the covering layer.

3. The method according to claim 1, which comprises depositing the covering layer using a plasma deposition process with a simultaneous back sputtering process.

4. The method according to claim 3, which comprises providing a pressure of 2 to 20 mTorr during the depositing of the covering layer.

5. The method according to claim 1, which comprises removing the covering layer using an etching process.

6. The method according to claim 3, which comprises using a power of 500 W during the back sputtering process.

7. The method according to claim 1, which comprises forming the sidewall with an angle of approximately 45°.

8. The method according to claim 1 which comprises forming the second protrusion structure with the small top surface being smaller than 1.5 times a depth of the trench formed between the first protrusion structure and the second protrusion structure.

9. The method according to claim 1, which comprises forming the first protrusion structure with the larger top surface being larger than three times a depth of the trench formed between the first protrusion structure and the second protrusion structure.

10. The method according to claim 1, which comprises using the covering layer as a mask during further processing of the second protrusion structure.

11. A method for fabricating a self-aligning mask in a configuration, which comprises the steps of:
   forming, on a semiconductor substrate, a second protrusion structure with a small top surface disposed at a distance from a first protrusion structure with a larger top surface, the first and second protrusion structures having the same height and constituting webs having differently sized cross sections with a trench formed therebetween, the small top surface and the larger top surface constituting the total top surface of the configuration;
   covering the first protrusion structure and the second protrusion structure with a covering layer, a first area of the covering layer covering the second protrusion structure having a smaller thickness than a second area of the covering layer covering the first protrusion structure, the covering step further including:
  forming the covering layer with a sidewall disposed between the first protrusion structure and the second protrusion structure, the sidewall declining from the first protrusion structure towards the second protrusion structure; and
  forming the covering layer with a substantially constant thickness above the second protrusion structure; and
removing the covering layer, using an etching process, substantially homogeneously until completely uncovering the second protrusion structure, and the first protrusion structure remaining completely covered by the covering layer.

12. A method for fabricating a self-aligning mask in a configuration, which comprises the steps of:
  forming, on a semiconductor substrate, a second protrusion structure with a small top surface disposed at a distance from a first protrusion structure with a larger top surface, the first and second protrusion structures having the same height and constituting webs having differently sized cross sections with a trench formed therebetween, the small top surface and the larger top surface constituting the total top surface of the configuration;
  covering the first protrusion structure and the second protrusion structure with a covering layer, a first area of the covering layer covering the second protrusion structure having a smaller thickness than a second area of the covering layer covering the first protrusion structure, the covering step further including:
    forming the covering layer with a sidewall disposed between the first protrusion structure and the second protrusion structure, the sidewall starting at the second area and ending at the first area, causing the sidewall to end before the second protrusion structure, the sidewall declining from the first protrusion structure towards the second structure;
    forming the covering layer with a substantially constant thickness above the second protrusion structure; and
  removing the covering layer substantially homogeneously until the second protrusion structure being completely uncovered, and the first protrusion structure remaining completely covered by the covering layer.

13. A method for fabricating a self-aligning mask in a configuration, which comprises the steps of:
  forming, on a semiconductor substrate, a second protrusion structure with a small top surface disposed at a distance from a first protrusion structure with a larger top surface, the first and second protrusion structures having the same height and constituting webs having differently sized cross sections with a trench formed therebetween, the small top surface and the larger top surface constituting the total top surface of the configuration;
  covering the first protrusion structure and the second protrusion structure with a covering layer, a first area of the covering layer covering the second protrusion structure having a smaller thickness than a second area of the covering layer covering the first protrusion structure, the covering step further including:
    forming the covering layer with a sidewall disposed between the first protrusion structure and the second protrusion structure, the sidewall declining from the first protrusion structure towards the second protrusion structure; and
    forming the covering layer with a substantially constant thickness above the second protrusion structure;
  removing the covering layer substantially homogeneously until the second protrusion structure being completely uncovered, and the first protrusion structure remaining completely covered by the covering layer; and
  using the covering layer as a mask during further processing of the second protrusion structure.

14. A method for fabricating a self-aligning mask in a configuration, which comprises the steps of:
  forming, on a semiconductor substrate, a second protrusion structure with a small top surface disposed at a distance from a first protrusion structure with a larger top surface, the first and second protrusion structures having the same height and constituting webs having differently sized cross sections with a trench formed therebetween, the small top surface and the larger top surface constituting the total top surface of the configuration;
  covering the first protrusion structure and the second protrusion structure with a covering layer, a first area of the covering layer covering the second protrusion structure having a smaller thickness than a second area of the covering layer covering the first protrusion structure, the covering step further including:
    forming the covering layer with a sidewall disposed between the first protrusion structure and the second protrusion structure, the sidewall declining from the first protrusion structure towards the second protrusion structure; and
    forming the covering layer with a substantially constant thickness above the second protrusion structure;
  removing the covering layer, using an etching process, substantially homogeneously until completely uncovering the second protrusion structure, and the first protrusion structure remaining completely covered by the covering layer; and
  using the covering layer as a mask during further processing of the second protrusion structure.

* * * * *